US008013617B2

(12) United States Patent
Honda et al.

(10) Patent No.: US 8,013,617 B2
(45) Date of Patent: Sep. 6, 2011

(54) TEST METHOD AND APPARATUS FOR SPARK PLUG CERAMIC INSULATOR

(75) Inventors: Toshitaka Honda, Aichi (JP); Hiroyuki Tanabe, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 566 days.

(21) Appl. No.: 12/045,491

(22) Filed: Mar. 10, 2008

(65) Prior Publication Data

US 2009/0224767 A1 Sep. 10, 2009

(51) Int. Cl.
*H01H 31/12* (2006.01)
*H01H 9/50* (2006.01)
*G01R 31/08* (2006.01)
*G01R 31/12* (2006.01)

(52) U.S. Cl. ........................ 324/551; 324/523; 324/536

(58) Field of Classification Search .................. 324/400, 324/401, 527, 551, 523, 536
See application file for complete search history.

(56) References Cited

U.S. PATENT DOCUMENTS 3,448,377 A * 6/1969 Seiwatz et al. ................ 324/501
4,654,489 A * 3/1987 Chabala et al. ............. 200/48 R
5,131,167 A * 7/1992 Bachmann et al. ............. 34/246
5,198,394 A 3/1993 Sugimoto et al.
5,254,954 A 10/1993 Fujimoto et al.
5,565,157 A 10/1996 Sugimoto et al.
6,239,052 B1 5/2001 Fukushima
6,858,975 B1 2/2005 Matsutani
6,909,286 B2 6/2005 Hori
7,557,496 B2 7/2009 Kato
2002/0033659 A1 3/2002 Nishikawa et al.
2002/0116985 A1 8/2002 Henning et al.
2003/0051341 A1 3/2003 Nishikawa et al.
2004/0012397 A1* 1/2004 Mizuno et al. ................ 324/522
2004/0051537 A1* 3/2004 Hori ............................ 324/557
2004/0235386 A1* 11/2004 Sreeram et al. ................. 445/47
2006/0205311 A1* 9/2006 Green et al. .................... 445/24

FOREIGN PATENT DOCUMENTS

JP 5766759 U 4/1982
JP 4289681 A 10/1992
JP 2004108817 A 4/2004
JP 2004526947 A 9/2004
JP 2007134132 A 5/2007

* cited by examiner

*Primary Examiner* — Amy He
(74) *Attorney, Agent, or Firm* — Sughrue Mion, PLLC

(57) ABSTRACT

A test method for a spark plug ceramic insulator includes placing a first electrode in an inner hole of the ceramic insulator and placing a second electrode on an outer peripheral side of the ceramic insulator, developing a defect in the ceramic insulator by the application of a first voltage onto the ceramic insulator between the first and second electrodes and detecting the defect in the ceramic insulator by the application of a second voltage, which is lower than a flashover voltage that causes a flashover of the ceramic insulator, onto the ceramic insulator between the first and second electrodes.

13 Claims, 5 Drawing Sheets

TEST METHOD AND APPARATUS FOR SPARK PLUG CERAMIC INSULATOR

BACKGROUND OF THE INVENTION

The present invention relates to a test method and apparatus for a spark plug ceramic insulator.

Patent Publication 1 discloses a method for testing a spark plug ceramic insulator. This test method enables detection of the presence or absence of a defect in the spark plug ceramic insulator by the passage of an electric current between a first electrode placed in an inner hole of the ceramic insulator and a second electrode placed on an outer peripheral side of the ceramic insulator. More specifically, the test method includes the steps of generating a spark discharge through the application of a voltage between the first and second electrodes, allowing a path identification means to identify whether the spark discharge pass through an open end of the inner hole of the ceramic insulator and allowing a judgment means to judge the presence or absence of a defect in the ceramic insulator according to the identification result of the path identification means. The path identification means has a photoelectric conversion element and a light converging element arranged adjacent to the open end of the inner hole of the ceramic insulator and, when the spark discharge occurs between the first and second electrodes and passes through the open end of the inner hole of the ceramic insulator (i.e. in the occurrence of a so-called flashover phenomenon in which the electric discharge leaks out along a surface of the ceramic insulator), identifies the path of the spark discharge upon detection of light from the spark discharge.

[Patent Publication 1] Japanese Patent No. 2550790

In the presence of a defect such as a pin hole in the ceramic insulator, the spark discharge occurs due to the voltage difference between the first and second electrodes and passes through the defect rather than through the open end of the inner hole of the ceramic insulator. The path identification means identifies that the path of the spark discharge does not pass through the open end of the inner hole of the ceramic insulator. Then, the judgment means judges the presence of the defect in the ceramic insulator based on the identification result of the path identification means. In the absence of a defect in the ceramic insulator, by contrast, the spark discharge occurs due to the voltage difference between the first and second electrodes and passes through the open end of the inner hole of the ceramic insulator. The path identification means identifies that the path of the spark discharge passes through the open end of the inner hole of the ceramic insulator. The judgment means judges the absence of the defect in the ceramic insulator based on the identification result of the path identification means. In this way, the presence or absence of the defect in the ceramic insulator can be detected.

When the spark plug is manufactured through the above test method, the spark plug is judged as a conforming product with a proper required withstand voltage. Herein, the required withstand voltage of the spark plug is defined as the sum of an actual application voltage (actual operating voltage) of the spark plug during use in an internal combustion engine and a predetermined margin for accidental spark plug voltage application. For example, the required withstand voltage can be set to 30 V allowing for a margin on the actual operating voltage of 15 to 20 kV. The above voltage values are all direct-current voltage values. In the case of using an alternating-current power source as a test power source, the voltage value can be converted to a peak-to-peak voltage value.

SUMMARY OF THE INVENTION

There is a growing demand to reduce the diameter of the spark plug in view of the tendency to increase the diameters of intake/exhaust ports of the internal combustion engine for engine output improvements. As the thickness of the ceramic insulator becomes decreased for diameter reduction of the spark plug, the insulating properties of the ceramic insulator may so deteriorate that the above conventional test method could fail to secure a sufficient accuracy of detection of the presence or absence of the defect in the ceramic insulator.

When the defect in the ceramic insulator is reasonably large in size, the spark discharge occurs and passes through the defect in the ceramic insulator even at the lower voltage difference than the required withstand voltage of the spark plug. The defect in the ceramic insulator can be thus detected by the above conventional test method. The smaller the defect in the ceramic insulator, however, the higher voltage difference is required for the spark discharge to occur and pass through the defect in the ceramic insulator whereby the voltage difference gets close to a voltage difference value (called a flashover voltage) at which the spark discharge occurs between the first and second electrodes and passes through the open end of the inner hole of the ceramic insulator. Depending on the test conditions e.g. the positions of the first and second electrodes and the thickness of the ceramic insulator, the application of such a high voltage difference may result in the flashover rather than the spark discharge passing through the defect in the ceramic insulator. In this case, the small defect in the ceramic insulator cannot be detected by the above conventional test method upon judging that the spark discharge passes through the open end of the inner hole of the ceramic insulator. There thus arises a possibility of misjudging the ceramic insulator as a conforming product irrespective of the potential presence of the defect through which the spark discharge would pass even at the same level of voltage difference as the required withstand voltage.

In view of the above conventional circumstances, it is therefore an object of the present invention to provide a test method and apparatus for detecting the presence or absence of a defect in a spark plug ceramic insulator more assuredly.

According to a first aspect of the present invention, there is provided a test method for a spark plug ceramic insulator, comprising: placing a first electrode in an inner hole of the ceramic insulator and placing a second electrode on an outer peripheral side of the ceramic insulator; developing a defect in the ceramic insulator by the application of a first voltage onto the ceramic insulator between the first and second electrodes; and detecting the defect in the ceramic insulator by the application of a second voltage onto the ceramic insulator between the first and second electrodes, the second voltage being lower than a flashover voltage that causes a flashover of the ceramic insulator.

According to a second aspect of the present invention, there is provided a test apparatus for a spark plug ceramic insulator, comprising: a first electrode placed in an inner hole of the ceramic insulator; a second electrode placed on an outer peripheral side of the ceramic insulator; a defect development unit that develops a defect in the ceramic insulator through the application of a first voltage onto the ceramic insulator between the first and second electrodes; and a defect detection unit that detects the defect in the ceramic insulator through the application of a second voltage onto the ceramic insulator between the first and second electrodes, the second voltage being lower than a flashover voltage that causes a flashover of the ceramic insulator.

DESCRIPTION OF THE EMBODIMENTS

Figure 1:
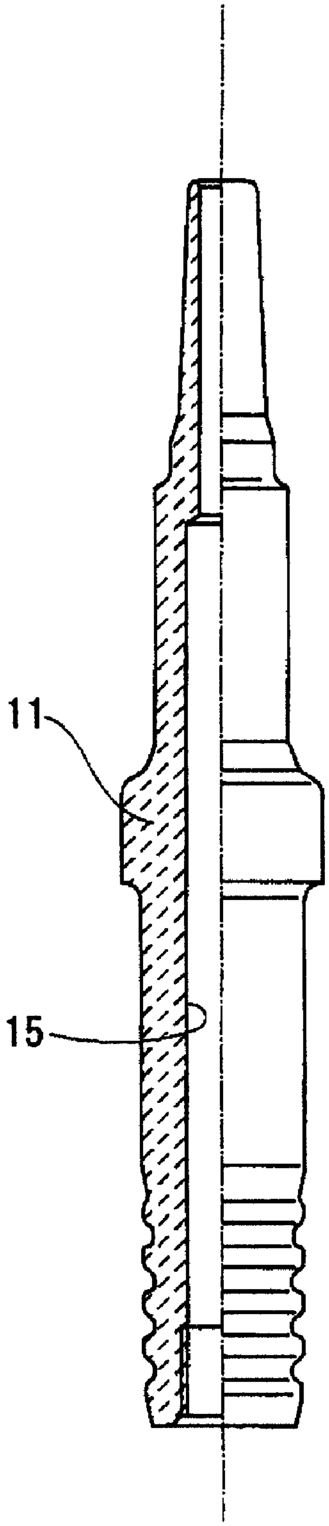
FIG. 1 is a partly sectional elevation view of a spark plug ceramic insulator according to a first embodiment of the present invention.

The first and second embodiments of the present invention will be described below with reference to the drawings. Herein, the term "front" refers to the upper side in the drawing and the term "rear" refers to the lower side in the drawing.

Figure 2:
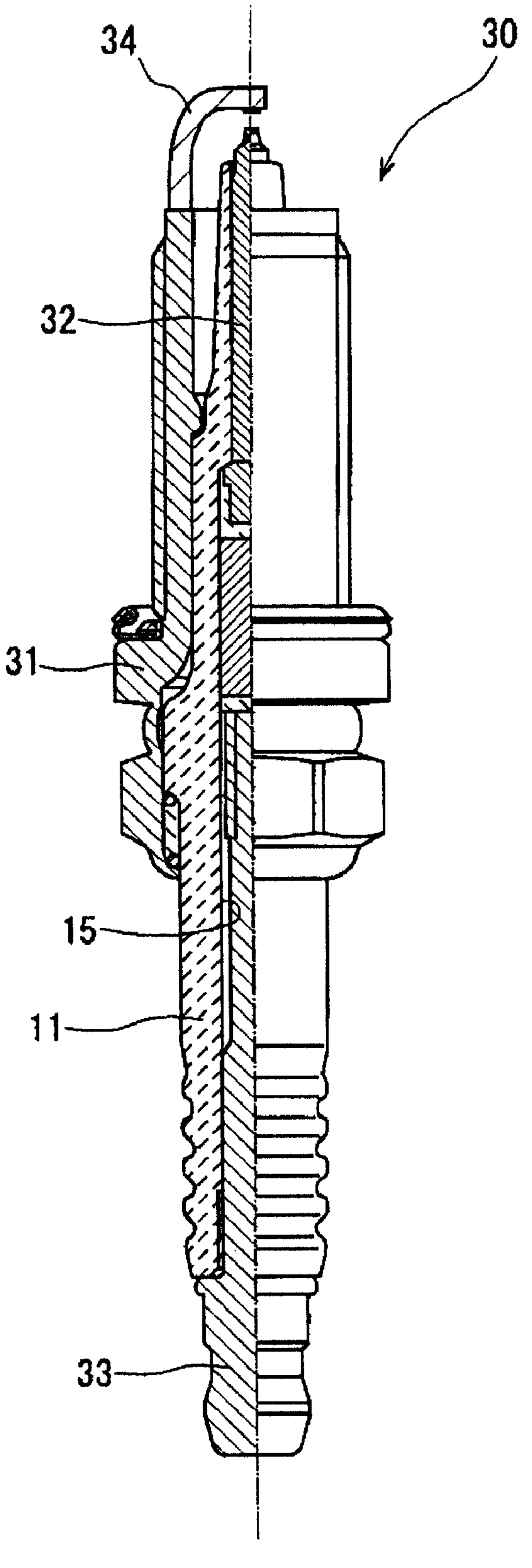
FIG. 2 is a partly sectional elevation view of a spark plug according to the first embodiment of the present invention.

As shown in FIG. 1, a ceramic insulator 11 for a spark plug 30 is a cylindrical piece of insulating material that is predominantly composed of e.g. $Al_2O_3$. The ceramic insulator 11 has a complicated shape formed with an inner through hole 15 to vary in thickness changing along its axis and defines a contour part of the spark plug 30 as shown in FIG. 2.

The spark plug 30 includes a cylindrical metal shell 31, a center electrode 32, a terminal 33 and a parallel ground electrode 34 in addition to the ceramic insulator 11. The ceramic insulator 11 is fixed in the metal shell 31 to extend axially of the metal shell 31 with opposite ends of the ceramic insulator 11 protruding from both ends of the metal shell 31. The center electrode 32 extends axially of the metal shell 31 and has a front end portion formed to define a discharge section at the front end of the ceramic insulator 11 and a rear end portion retained within the ceramic insulator 11. The terminal 33 extends axially of the metal shell 31 and has a front end electrically connected to the center electrode 32 within the ceramic insulator 11 and a rear end protruding from the rear end of the ceramic insulator 11. The parallel ground electrode 34 is fixed at one end thereof to the metal shell 31 to define a discharge gap between the other end of the parallel ground electrode 34 and the discharge section of the center electrode 32.

The actual operating voltage of the spark plug 30 and the required withstand voltage of the ceramic insulator 11 are set to about DC 20 kV and about DC 30 kV, respectively, as the spark plug 30 is designed for use in an automotive engine or the like.

First Embodiment

In the first embodiment, the presence or absence of a defect in the ceramic insulator 11 is detected by the following test.

Figure 3:
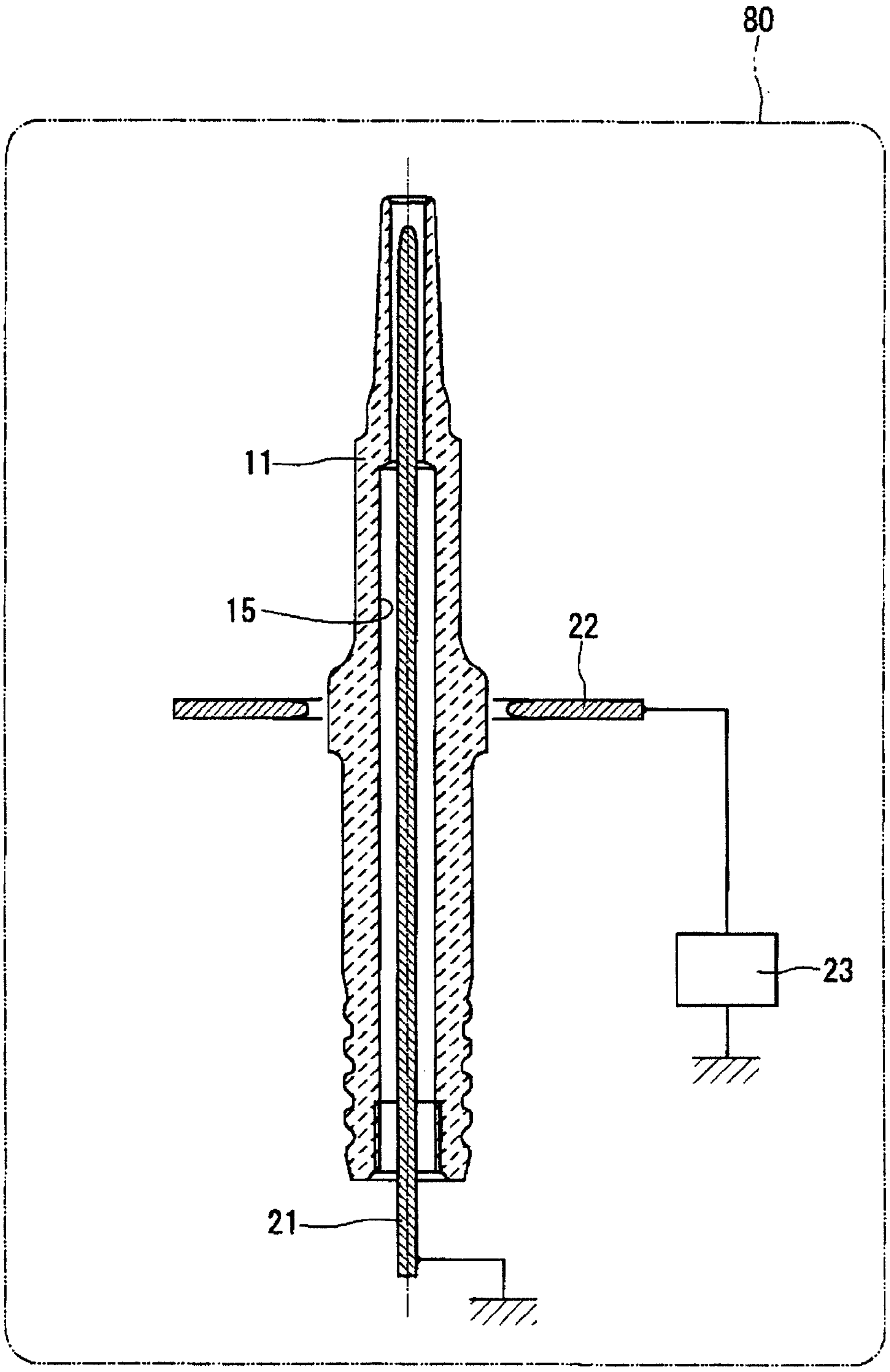
FIG. 3 is a schematic section view showing a first test process of a test method for the spark plug ceramic insulator according to the first embodiment of the present invention.

In the first test process, a rod-shaped first electrode 21 and an elongated cross-section annular second electrode 22 are placed by inserting the first electrode 21 in the inner through hole 15 of the ceramic insulator 11 and arranging the second electrode 22 on the outer peripheral side of the ceramic insulator 11 as shown in FIG. 3. The first electrode 21 and the second electrode 22 are also connected to a ground and a power source 23, respectively. The first electrode 21 and the second electrode 22 may alternatively be connected to the power source 23 and the ground, respectively. Herein, the power source 23 functions as a defect development means (first voltage application means) for developing a potential defect in the ceramic insulator 11 in combination with the first electrode 21 and the second electrode 22.

Then, a first voltage V1 is applied between the first electrode 21 and the second electrode 22 by the power source 23. In the presence of a defect such as a pin hole in the ceramic insulator 11, a spark discharge occurs and passes through the defect during the application of the first voltage V1 between the first electrode 21 and the second electrode 22. As a result, the defect of the ceramic insulator 11 gets developed to a larger size by penetration/breakage of the defective area of the ceramic insulator 11. In the absence of the defect in the ceramic insulator 11, by contrast, no spark discharge occurs during the application of the first voltage V1 between the first electrode 21 and the second electrode 22.

Preferably, the first voltage V1 is higher than or equal to the required withstand voltage of the spark plug 30 for use in the internal combustion engine. When the first voltage V1 is at least equal to the required withstand voltage, the defect in the ceramic insulator 11 can be developed assuredly. It is thus possible to allow assured detection of such a penetration/breakage of the ceramic insulator 11 as to be caused by the application of the voltage not lower than the actual operating voltage and not higher than the required withstand voltage (i.e. accidental voltage higher than proper). In particular, it is possible to ensure higher reliability for detection of the penetration/breakage of the ceramic insulator 11 when the first voltage V1 is higher than the required withstand voltage.

Further, the first voltage V1 is preferably lower than a flashover voltage Vf that causes a flashover phenomena where the electric discharge leaks out along a surface of the ceramic insulator 11. When the first voltage V1 is lower than the flashover voltage Vf, it is possible to prevent the occurrence of the flashover and develop the defect in the ceramic insulator 11 assuredly without being interfered with by the flashover.

In the first test process, it is also preferable to apply the first voltage V1 under the condition that the ceramic insulator 11, the first electrode 21 and the second electrode 22 are placed in a flashover-preventing environment. When the ceramic insulator 11, the first electrode 21 and the second electrode 22 are placed in the flashover-preventing environment, the flashover voltage Vf of the ceramic insulator 11 becomes higher than usual. This makes it possible to set the first voltage V1 to a higher level and develop the defect in the ceramic insulator 11 more assuredly.

The flashover-preventing environment can be either a high-pressure air atmosphere, an inert gas atmosphere of e.g. helium that does not cause a decrease in discharge voltage, or an oil-tank inside atmosphere. For prevention of the flashover, it is feasible that the front end of the first electrode 21 is recessed to a certain point in the open end of the inner through hole 15 of the ceramic insulator 11 under the above atmosphere or in normal atmosphere. It is also feasible to place an insulating plate or cap between the open end of the inner through hole 15 of the ceramic insulator 11 and the second electrode 22 and physically cut off the flashover path for prevention of the flashover.

In the first embodiment, the front end of the first electrode 21 is recessed to a certain point in the open end of the inner through hole 15 of the ceramic insulator 11 in order to prevent the occurrence of the flashover. The second electrode 22 is located at substantially the same distance from the front and rear ends of the ceramic insulator 11. After the ceramic insulator 11, the first electrode 21 and the second electrode 22 are enclosed in a closed container 80, the air inside the closed container 80 is pressurized to create the high-pressure air atmosphere for prevention of the flashover.

In addition, the first voltage V1 is set to about AC 15V so as to be higher than or equal to the required withstand voltage and lower than the flashover voltage Vf (about AC 18 kV) in the first embodiment.

The position of the second electrode 22 relative to the ceramic insulator 11 may be changed in the first test process, thereby reducing the distance from the second electrode 22 to the defect in the unspecified area of the ceramic insulator 11. This makes it possible to pass the spark discharge through the defect and develop the defect in the ceramic insulator 11 assuredly. The position of the second electrode 22 can be changed by appropriate selection of a movement parallel to the axis of the ceramic insulator 11, a rotation about the axis of the ceramic insulator 11 or a combination thereof. The second electrode 22 can also be moved stepwisely with a given pitch. In order to reduce the distance to the defect in unspecified area of the ceramic insulator 11, it is alternatively feasible to use a plurality of second electrodes 22 in the same manner as in the after-mentioned second test process.

Furthermore, it is preferable to increase or decrease the first voltage V1 according to the positional relationship of the first electrode 21 and the second electrode 22 and/or the thickness of the ceramic insulator 11. As the ceramic insulator 11 has a complicated shape varying in thickness along the axis, the first voltage V1 applied to the thin-walled sections of the ceramic insulator 11 is not necessarily the same level as that applied to the thick-walled section of the ceramic insulator 11 and can be set to a minimum level required to develop the defect in the thin-walled sections of the ceramic insulator 11. This makes it possible to avoid redundant voltage application, minimize the occurrence of the flashover and develop the defect in the ceramic insulator 11 more assuredly. In the case of changing the positional relationship of the first electrode 21 and the second electrode 22, the same effects can be obtained by increasing or decreasing the first voltage V1 appropriately.

Figure 4:
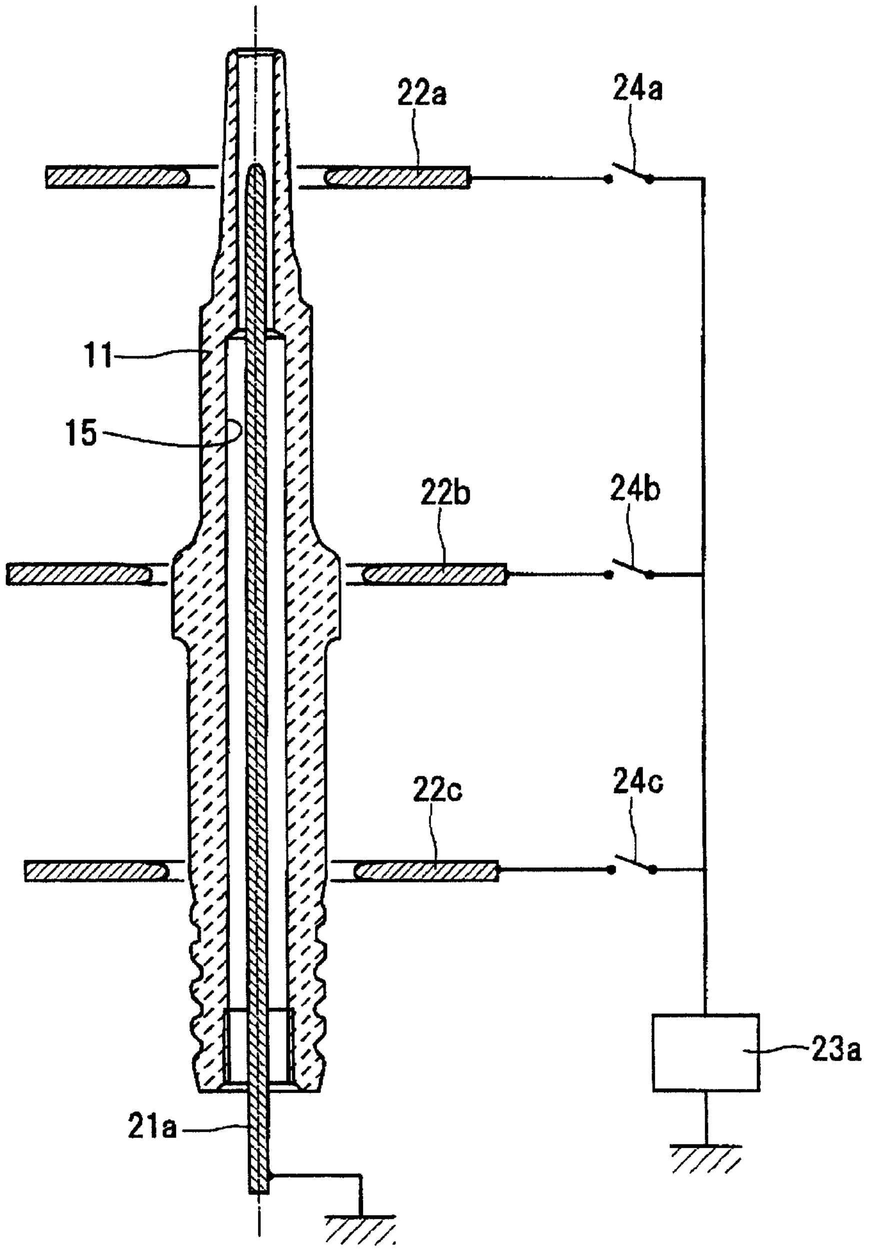
FIG. 4 is a schematic section view showing a second test process of the test method for the spark plug ceramic insulator according to the first embodiment of the present invention.
Figure 5:
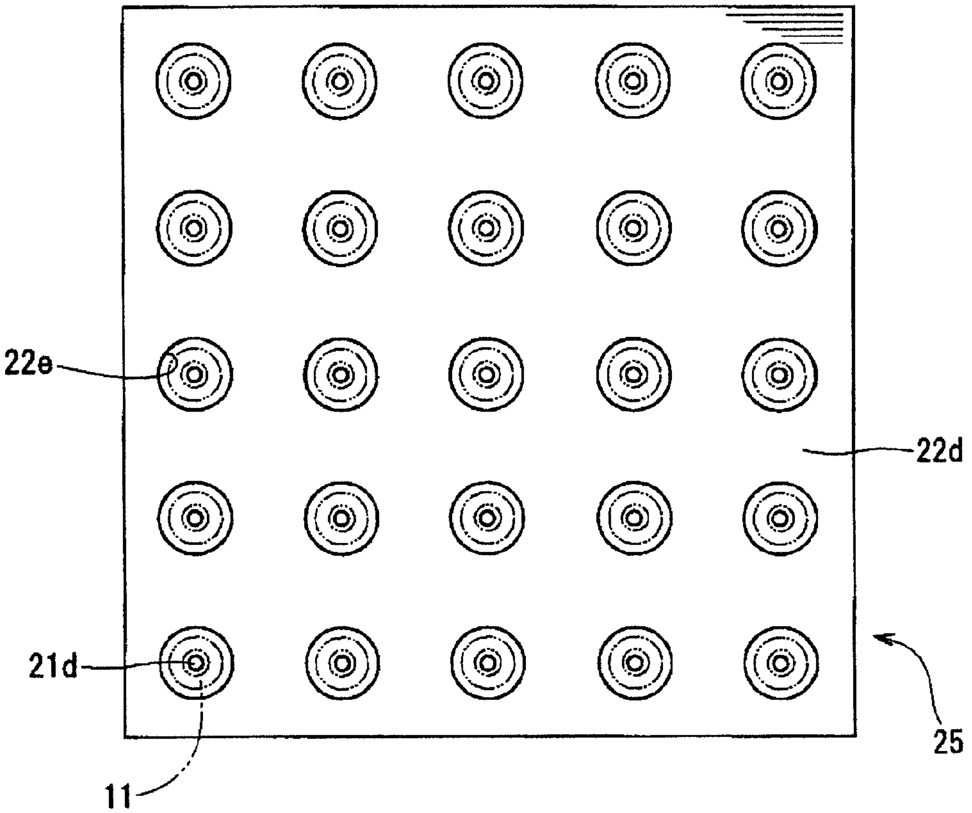
FIG. 5 is a top view of a test apparatus for use in a test method for a spark plug ceramic insulator according to a second embodiment of the present invention.
Figure 6:
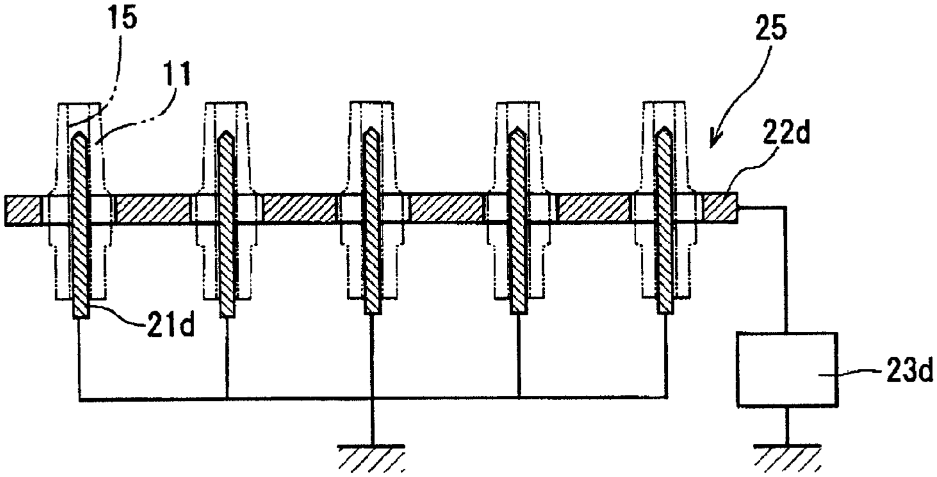
FIG. 6 is a section view of the test apparatus for use in the test method for the spark plug ceramic insulator according to the second embodiment of the present invention.

In the subsequent second test process, a rod-shaped first electrode 21*a* and elongated cross-section annular second electrodes 22*a*, 22*b* and 22*c* are placed by inserting the first electrode 21*a* in the inner through hole 15 of the ceramic insulator 11 and arranging the second electrodes 22*a*, 22*b* and 22*c* on the outer peripheral side of the ceramic insulator 11 as shown in FIG. 4. At this time, the front end of the first electrode 21*a* is recessed to a certain point in the open end of the inner through hole 15 of the ceramic insulator 11 in the same manner as in the first test process. The second electrodes 22*a*, 22*b* and 22*c* are located in three vertical positions: front, middle and rear positions on the ceramic insulator 11. The first electrode 21*a* is connected to a ground. The second electrodes 22*a*, 22*b* and 22*c* are connected to a power source 23 via selector switches 24*a*, 24*b* and 24*c*, respectively. The inner diameters of the front and rear second electrodes 22*a* and 22*c* are made small so as to provide optimal clearance according to the shape of the thin-walled sections of the ceramic insulator 11, whereas the inner diameter of the middle second electrode 22*b* is made large so as to provide optimal clearance according to the shape of thickwalled section of the ceramic insulator 11. Herein, the power source 23 and the selector switches 24*a*, 24*b* and 24*c* function as a defect detection means (second voltage application means) for detecting the developed defect in the ceramic insulator 11 in combination with the first electrode 21*a* and the second electrodes 22*a*, 22*b* and 22*c*.

Then, a second voltage V2 is applied between the first electrode 21*a* and the second electrode 22*a*, 22*b*, 22*c* by the power source 23*a*. In the presence of the defect developed in the ceramic insulator 11 by the application of the first voltage V1, a spark discharge occurs and passes through the developed defect during the application of the second voltage V2 between the first electrode 21*a* and the second electrode 22*a*, 22*b*, 22*c*. It is thus possible to detect even the small defect assuredly.

The second voltage V2 is preferably set lower than the first voltage V1. As the defect in the ceramic insulator 11 has been developed through the application of the first voltage V1, the second voltage V2 can be thus set to such a low level that the spark plug occurs and passes through the developed defect in the ceramic insulator 11. There is no need to further develop the defect in the ceramic insulator 11 through the application of the second voltage V2. It is thus possible to prevent the flashover and detect the defect in the ceramic insulator 11 assuredly by lowering the second voltage V2.

In the first embodiment, the second voltage V2 is set lower than the first voltage V1 and set lower than the flashover voltage Vf so as to prevent the occurrence of the flashover more assuredly during the detection of the defect.

In order for the spark discharge to occur and pass through the developed defect more assuredly through the application of such a low second voltage V2, it is preferable to apply the second voltage V2 under a normal atmosphere, without using a closed container as in the first test process. Based on this principle, it is alternatively feasible to apply the second voltage V2 in a low-pressure atmosphere or an atmosphere filled with a gas capable of readily causing the spark discharge. In this case, it is certainly desirable to set the second voltage V2 to such a level as not to cause the flashover.

In the first embodiment, the second electrodes 22*a*, 22*b* and 22*c* are located in three vertical positions relative to the ceramic insulator 11 so as to reduce the distance from any one of the second electrodes 22*a*, 22*b* and 22*c* to the defect in the unspecified area of the ceramic insulator 11 in the second test process. This makes it possible to pass the spark discharge through the defect in the ceramic insulator 11 and detect the defect in the ceramic insulator 11 assuredly.

The position of the second electrode relative to the ceramic insulator 11 may also be changed in the second test process, so as to reduce the distance from the second electrode to the defect in the unspecified area of the ceramic insulator 11 especially when the second electrode is shorter than the longitudinal length of the ceramic insulator 11. This makes it possible to pass the spark discharge through the defect in the ceramic insulator 11 and detect the defect in the ceramic insulator I 1 more assuredly. This also makes it possible to identify the occurrence position of the spark discharge for ease of follow-up study on the cause of the defect and the like.

It is also preferable to increase or decrease the second voltage V2 according to the positional relationship of the first electrode 21*a* and the second electrode 22*a*, 22*b*, 22*c* and/or the thickness of the ceramic insulator 11. In the first embodiment, the second voltage V2 is set to about AC 10 kV when applied between the first electrode 21*a* and the second electrode 22*a* by connection of the selector switch 24*a*, to about AC 12 kV when applied between the first electrode 21*a* and the second electrode 22*b* by connection of the selector switch 24*b* and to about AC 11 kV when applied between the first electrode 21*a* and the second electrode 22*c* by connection of the selector switch 24*c*. As the ceramic insulator 11 has a complicated shape varying in thickness along the axis, it is possible to eliminate the possibility of deterioration in detection accuracy relative to the thin-walled sections of the ceramic insulator 11 by setting the second voltage V2 in accordance with the thin-walled section of the ceramic insulator 11. In the case of changing the positional relationship of the first electrode 21*a* and the second electrode 22, the same effects can be obtained by increasing or decreasing the second voltage V2 appropriately.

In this way, the potential defect that can cause any trouble during its actual use (the defect through which the spark discharge passes even by the application of the voltage higher than the required withstand voltage) has been penetrated and developed before the detection of the defect in the ceramic insulator 11 in the first embodiment. The detect in the ceramic insulator 11 can be detected assuredly without the need to apply such a high voltage as to cause the flashover. It is accordingly possible to judge the ceramic insulator 11 as a failing product with a potential defect more assuredly and secure the insulating properties of the ceramic insulator 11 in view of the recent growing demand for diameter reduction of the spark plug 30.

Although the first electrode 21 and the second electrode 22 of the first test process and the first electrode 21*a* and the second electrodes 22*a*, 22*b* and 22*c* of the second test process are prepared separately in the first embodiment, the common first and second electrodes may be used in the first and second test processes. The center electrode 32 of the spark plug 30 may be used in place of the first electrode 21, 21*a*. The second electrodes 22, 22*a*, 22*b* and 22*c* may be rod-shaped although they are annular about the axis of the ceramic insulator 11 in the first embodiment. The second electrodes 22, 22*a*, 22*b* and 22*c* may alternatively be cylindrical in shape unless there occurs no flashover between the first electrode 21, 21*a* and the second electrode 22, 22*a*, 22*b*, 22*c*.

Second Embodiment

In the second embodiment, a plurality of ceramic insulators 11 can be tested simultaneously by means of a test apparatus 25. Herein, explanations of the same configurations and effects thereof as in the first embodiment will be omitted.

The test apparatus 25 has first electrodes 21*d*, a second electrode 22*d* and a power source 23*d*. The second electrode 22*d* is a mesh-shaped plate having multiple openings 22*e* throughout its length and breadth. The first electrodes 21*d* are rod-shaped and inserted through the centers of the openings 22*e* so as to correspond to the ceramic insulators 11, respectively. Each of the first electrodes 21*d* is connected to a ground. The second electrode 22*d* is connected to a power source 23*d*. The first electrodes 21*d* and the second electrode 22*d* may alternatively be connected to the power source 23*d* and the ground, respectively. The test apparatus 25 can be thus simplified by using the power supply circuit 23*d* common to the multiple electrode members.

With the above test apparatus 25, the defect detection test is performed by the following procedure in the second embodiment.

In the first test process, the ceramic insulators 11 are placed by inserting the first electrodes 21*d* in the inner through holes 15 of the ceramic insulators 11 and arranging the second electrode 22*d* on the outer peripheral sides of the ceramic insulators 11 in such a manner as to insert the ceramic insulators 11 through the openings 22*e* of the meshed second electrode 22*d*, respectively.

After the ceramic insulators 11, the first electrodes 21*d* and the second electrode 22*d* are enclosed in a closed container (not shown), the air inside the closed container is pressurized to create a high-pressure air atmosphere.

Then, a first voltage V1 is applied between each of the first electrodes 21*d* and the second electrode 22*d* by the power source 23*d*. Herein, the first voltage V1 is set to about AC 15 kV so as to be higher than or equal to the required withstand voltage of the ceramic insulator 11 and lower than the flashover voltage Vf as is the case with the first embodiment. In the presence of a defect such as a pin hole in any of the ceramic insulators 11, a spark discharge occurs and passes through the defect by the application of the first voltage V1 between the first electrode 21*d* and the second electrode 22*d*. As a result, the defect in the ceramic insulator 11 becomes developed to a larger size. In the absence of a defect in any of the ceramic insulators 11, by contrast, no spark discharge occurs by the application of the first voltage V1 between the first electrode 21*d* and the second electrode 22*d*.

The test proceeds to the second test process by removing the closed container while holding the plurality of the ceramic insulators 11 in the test apparatus 25.

In the second test process, a second voltage V2 is applied between each of the first electrodes 21*d* and the second electrode 22*d* by the power source 23*d*. Herein, the second voltage V2 is set to about AC 10 kV so as to be lower than the first voltage V1 and lower than the flashover voltage Vf. In the presence of the developed defect in any of the ceramic insulators 11, a spark discharge occurs and passes through the developed defect in any of the ceramic insulators 11 by the application of the second voltage V2 between the first electrode 21*d* and the second electrode 22*d*. It is thus possible to detect the defect in any of the ceramic insulators 11 assuredly in the second test process.

In the case where the plurality of ceramic insulators 11 are tested through the application of the second voltage V2 by using the common power supply circuit 23*d* for at least either of the first electrodes 21*d* and the second electrode 22*d* (in the second embodiment, the second electrode 22*d*), there is a possibility of failing to specify which of the ceramic insulators 11 is a failing product even when there is a defect in any of the ceramic insulators 11. Upon detection of the defect in any of the ceramic insulator 11, each of the ceramic insulators 11 is tested through the second test process as in the first embodiment. This makes it possible to specify and eliminate a failing product from the large number of ceramic insulators 11 assuredly. Under the current circumstance of the manufacturing locations with improved quality control, a failing product is not detected so frequently but is rarely detected during the simultaneous test of the plurality of ceramic insulators 11. The individual second test process of each of the ceramic insulators 11 will thus not result in deterioration of test process efficiency.

In this way, it is possible in the second embodiment to test the plurality of ceramic insulator 11 simultaneously for substantial improvement of test process efficiency.

Although the meshed second electrode 22*d* is used in such a manner that the electrode openings 22*e* corresponds to the plural electrode members in the second embodiment, a plurality of separate electrode members may be arranged in multiple positions parallel to the axes of the ceramic insulators 11 or around the ceramic insulators 11 centering on the axes of the ceramic insulators 11.

Although the present invention has been described with reference to the above first and second embodiments, the invention is not limited to these first and second embodiments. Various modification and variation of the embodiments described above will occur to those skilled in the art in light of the above teachings.

For example, the present invention can be applied to the test of the ceramic insulator 11 with no defect although the above embodiments of the present invention refer to the test of the ceramic insulator 11 with the defect. In the absence of the defect in the ceramic insulator 11, no spark discharge ideally occurs between the first electrode 21, 21*d* and the second electrode 22, 22*d*. In the first test process, however, the possibility of the flashover phenomenon is not zero when the first voltage V1 is set to a maximum level just below the flashover voltage. This makes it impossible to judge the occurrence of the penetration/breakage of the ceramic insulator 11 or the occurrence of the flashover based on the passage of an electric current between the first electrode 21, 21*d* and the second electrode 22, 22*d*. The ceramic insulator 11 is thus tested and judged as a conforming product upon detection of no electric current between the first electrode 21*a*, 21*d* and the second electrode 22*a*, 22*b*, 22*c*, 22*d* through the application of the second voltage V2 in the second test process.

What is claimed is:

1. A test method for a spark plug ceramic insulator, comprising:

placing a first electrode in an inner hole of the ceramic insulator and placing a second electrode on an outer peripheral side of the ceramic insulator;

developing a defect in the ceramic insulator by the application of a first voltage onto the ceramic insulator between the first and second electrodes; and detecting the defect in the ceramic insulator by the application of a second voltage onto the ceramic insulator between the first and second electrodes, the second voltage being lower than a flashover voltage that causes a flashover of the ceramic insulator.

2. The test method for the spark plug ceramic insulator according to claim 1, wherein the first voltage is higher than or equal to a required withstand voltage of a spark plug for use in an internal combustion engine.

3. The test method for the spark plug ceramic insulator according to claim 1, wherein the second voltage is lower than the first voltage.

4. The test method for the spark plug ceramic insulator according to claim 1, wherein the first voltage is lower than the flashover voltage.

5. The test method for the spark plug ceramic insulator according to claim 1, wherein the ceramic insulator and the first and second electrodes are placed in a flashover-preventing environment during said defect developing step.

6. The test method for the spark plug ceramic insulator according to claim 5, wherein the flashover-preventing environment comprises a high pressure atmosphere, an inert gas atmosphere, or an atmosphere inside of an oil-tank.

7. The test method for the spark plug ceramic insulator according to claim 1, wherein a position of the second electrode relative to the ceramic insulator is changed during said defect developing step.

8. The test method for the spark plug ceramic insulator according to claim 7, wherein the first voltage is increased and decreased according to at least one of a positional relationship of the first and second electrodes and a thickness of the ceramic insulator during said defect developing step.

9. The test method for the spark plug ceramic insulator according to claim 1, wherein a position of the second electrode relative to the ceramic insulator is changed during said defect detecting step.

10. The test method for the spark plug ceramic insulator according to claim 9, wherein the second voltage is increased and decreased according to at least one of a positional relationship of the first and second electrodes and a thickness of the ceramic insulator during said defect detecting step.

11. The test method for the spark plug ceramic insulator according to claim 1, wherein the first electrode has a plurality of electrode members corresponding to a plurality of ceramic insulators; the second electrode has a mesh shape with mesh openings for insertion of the plurality of ceramic insulators; one of the first and second electrodes is connected to a common power source; and the other of the first and second electrodes is connected to a ground.

12. The test method for the spark plug ceramic insulator according to claim 11, wherein said defect detecting step is performed on each of the plurality of ceramic insulators upon detection of the defect in any of ceramic insulators.

13. A test apparatus for a spark plug ceramic insulator, comprising:

a first electrode placed in an inner hole of the ceramic insulator;

a second electrode placed on an outer peripheral side of the ceramic insulator;

a defect development unit that develops a defect in the ceramic insulator through the application of a first voltage onto the ceramic insulator between the first and second electrodes; and a defect detection unit that detects the defect in the ceramic insulator through the application of a second voltage onto the ceramic insulator between the first and second electrodes, the second voltage being lower than a flashover voltage that causes a flashover of the ceramic insulator.

* * * * *